(12) United States Patent
Pazidis et al.

(10) Patent No.: US 7,518,797 B2
(45) Date of Patent: Apr. 14, 2009

(54) MICROLITHOGRAPHIC EXPOSURE APPARATUS

(75) Inventors: Alexandra Pazidis, Aalen (DE); Christoph Zaczek, Heubach (DE)

(73) Assignee: Carl Zeiss SMT AG, Oberkochen (DE)

( * ) Notice: Subject to any disclaimer, the term of this patent is extended or adjusted under 35 U.S.C. 154(b) by 364 days.

(21) Appl. No.: 11/607,024

(22) Filed: Nov. 30, 2006

(65) Prior Publication Data

US 2007/0128453 A1 Jun. 7, 2007

Related U.S. Application Data

(60) Provisional application No. 60/741,605, filed on Dec. 2, 2005.

(51) Int. Cl.
*G02B 1/10* (2006.01)
*G03B 27/54* (2006.01)
(52) U.S. Cl. .......................... 359/586; 355/67
(58) Field of Classification Search ............... 359/580, 359/581, 586, 587, 588, 589; 355/67
See application file for complete search history.

(56) References Cited

U.S. PATENT DOCUMENTS

| 5,932,354 | A | 8/1999 | Takeda et al. |
| 6,072,629 | A | 6/2000 | Fan et al. |
| 6,863,398 | B2 | 3/2005 | Bauer et al. |
| 2005/0157401 | A1 | 7/2005 | Goehnermeier et al. |
| 2006/0245057 | A1* | 11/2006 | Van Herpen et al. ........ 359/587 |

FOREIGN PATENT DOCUMENTS

| JP | 2002-189101 | 7/2002 |
| JP | 2004/302113 | 10/2004 |
| JP | 2005-345492 A | 12/2005 |
| WO | 03/077007 A2 | 9/2003 |
| WO | 05/119369 A1 | 12/2005 |
| WO | 06/063855 A2 | 6/2006 |

OTHER PUBLICATIONS

Dirks et al., "Columnar Microstructure in Vapor-Deposited This Films," This Solid Films, 47(1977), pp. 219-233.

* cited by examiner

*Primary Examiner*—Alessandro Amari
(74) *Attorney, Agent, or Firm*—Fish & Richardson P.C.

(57) ABSTRACT

The disclosure relates to optical systems, such as illumination devices or projection objectives of microlithographic projection exposure apparatuses, that include at least one optical element having at least one curved lens surface which carries an interference layer system. The interference layer system includes an alternating sequence of layers. At least one of the layers is subdivided by at least one intermediate layer having a thickness of not more than 5 nanometers. A column structure which is formed in the at least one subdivided layer is interrupted by the at least one intermediate layer.

24 Claims, 7 Drawing Sheets

MICROLITHOGRAPHIC EXPOSURE APPARATUS

CROSS-REFERENCE TO RELATED APPLICATION

This application claims priority under 35 U.S.C. §119(e)(1) to U.S. Provisional Application No. 60/741,605, filed Dec. 2, 2005, which is hereby incorporated by reference.

BACKGROUND OF THE INVENTION

1. Field of the Invention

The disclosure relates to optical systems, such as illumination devices or projection objectives of microlithographic exposure apparatuses.

2. State of the Prior Art

Microlithography is used for the manufacture of microstructured components such as for example integrated circuits or liquid crystal displays (LCDs). The microlithography process is performed in a so-called projection exposure apparatus which includes an illumination system and a projection objective. The image of a mask (reticle) which is illuminated by use of the illumination system is projected by use of the projection objective onto a substrate (e.g. a silicon wafer) that is coated with a light-sensitive coating layer (e.g. photoresist) and set up in the image plane of the projection objective in order to transfer the mask structure to the light-sensitive coating of the substrate.

A diversity of concepts are known which serve the purpose of avoiding an undesirable change of the state of polarization of the light used in the microlithography process. Such a change can be caused in the illumination device as well as in the projection objective for example due to intrinsic or stress-induced birefringence of the optical elements being used, or also due to phase jumps, for example on reflective components, which are accompanied by a retardation. The term "retardation" as used here is the difference between the optical path lengths of two orthogonal states of polarization (i.e. states of polarization that are perpendicular to each other).

According to a concept disclosed among others in WO 03/077007 A2, at least one optical surface (for example of an exchangeable optical element) in an objective with a plurality of crystal lenses that are in particular of a fluoride crystal is coated with a compensation coating which has for example a distribution of effective birefringence values that varies from place to place, whereby for example the entire objective can be adjusted with regard to its optical polarization properties, i.e. the distribution of the optical path differences for the entire objective can be reduced in comparison to the distribution that exists without the compensation coating, or whereby the intrinsic birefringence of the substrate that carries the coating, for example a lens of fluoride crystal, can be compensated. The disclosure content of WO 03/077007 A2 in its entirety is hereby incorporated by reference in the present application.

Furthermore, polarizer devices including a plurality of discrete layers of birefringent film are inter alia disclosed in U.S. Pat. No. 6,072,629. An obliquely deposited film element including alternately deposited layers on a substrate is inter alia disclosed in U.S. Pat. No. 5,932,354.

SUMMARY OF THE INVENTION

In some embodiments, optical systems, in particular illumination devices or projection objectives of microlithographic projection exposure apparatuses, are provided in which an undesirable change of the state of polarization which occurs as a consequence of an interference layer in the system, such as e.g. an anti-reflex layer, can be reduced (e.g., eliminated).

In one aspect, the invention features an optical system, in particular an illumination device or a projection objective of a microlithographic projection exposure apparatus, includes at least one optical element having at least one curved lens surface which carries an interference layer system. The interference layer system including an alternating sequence of layers. At least one of the layers is subdivided by at least one intermediate layer which has a thickness of not more than 5 nanometers. A column structure which is formed in the at least one subdivided layer is interrupted by the at least one intermediate layer.

It is believed that, by providing at least one intermediate layer such as to subdivide at least one of the layers of the interference layer system to thereby interrupt a column structure being formed in the subdivided layer, a reduction of the form birefringence in the interference layer system can be achieved in a relatively simple and relatively controllable manner. By using this concept, one can in particular adjust the total of the phase split caused by the interference layer system to a minimal value, so that the optical element behaves substantially neutral in regard to polarization. On the other hand, one can also set by use of the at least one intermediate layer a desired or given distribution of the effective birefringence caused by the interference layer system, for example for the purpose of compensating a retardation that may exist in another place in an optical system (e.g., in an illumination device or a projection objective of a microlithographic projection exposure apparatus).

In some embodiments, a retardation in the interference layer system caused by form birefringence is reduced due to the at least one intermediate layer in comparison to an analogous interference layer system that does not include the intermediate layer.

Here and in the following, an "analogous" interference layer system (not including the at least one intermediate layer) is to be understood as an interference layer system wherein the alternating sequence of layers is the same with respect to materials, thickness and order of the layers as the interference layer system with intermediate layer(s), if the intermediate layer(s) is/are not taken into consideration.

In other words, in some embodiments, the analogous interference layer system that does not include the at least one intermediate layer differs from the referenced interference layer system with intermediate layer(s) only in so far as the layer being subdivided by the intermediate layer(s) in the interference layer system is not subdivided in the analogous interference layer system.

It can be desirable for the form birefringence to be reduced due to the at least one intermediate layer in comparison to an analogous interference layer system that does not include the intermediate layer by at least 20% (e.g., at least 40%, at least 50%) relative to the maximum obtained value of the phase split.

The term "form birefringence" refers to the presence of two different refractive indices due to the layer structure that exists in a grown layer system which typically consists of a multitude of columns containing the material of the respective layer, with pores lying in between, as shown schematically in FIG. 1. The magnitude of the form birefringence in this case depends on the angle of inclination α of the columns which is determined by the vapor-deposition angle β.

One effect being responsible for the form birefringence is that in an obliquely deposited layer system, the columnar structure is less closely spaced in the vapor incidence plane than normal (i.e. perpendicular) to the vapor incidence plane.

A further geometrical effect can be explained as follows. For the sake of simplification one refractive index in the growth direction of the column and another refractive index in the respective perpendicular direction can be defined according to the following relationships.

$$\varepsilon_\perp = \varepsilon_2 \quad (1)$$

$$\varepsilon_\parallel = \frac{\varepsilon_1 \cdot \varepsilon_3}{\varepsilon_3 \cdot \cos^2\alpha + \varepsilon_1 \cdot \sin^2\alpha} \quad (2)$$

wherein $\epsilon_\perp$ and $\epsilon_\parallel$ represent the respective dielectric constants perpendicular and parallel to the plane of vapor deposition, with $\epsilon_i = n_i^2$ for nonconductive, nonmagnetic materials.

By the inventive concept of inserting one or more relatively thin layers, it is believed that the column growth in the layers of the interference layer system can be interrupted and the alignment of the columns can be impeded. When this measure is taken, one or more intermediate layers, typically of substantially smaller thickness, are built into the alternating sequence of the layers of the layer system. This concept has the advantage that the degree of modulation of the form birefringence can be changed without having to change the geometry of the vapor deposition apparatus, the layer thicknesses, or the temperature.

In some embodiments, the at least one intermediate layer has a thickness at least ten times smaller (e.g., at least fifteen times smaller, at least twenty times smaller) than the thickness of the subdivided layer.

In certain embodiments, the at least one intermediate layer has an optical thickness of not more than 2 nm (e.g., from 0.5 nm to 2 nm).

In some embodiments, the at least one intermediate layer has an optical thickness that is less than 0.05 times the thickness of the operating wavelength.

In certain embodiments, the curved lens surface has a maximum tangent angle of its optically active surface of at least 200 (e.g., at least 30°, at least 45°), where the tangent angle is defined for each position on the optically active lens surface as the angle between the tangent to the lens surface at this position and the tangent to the lens surface at the vertex of the curved lens surface.

In some embodiments, all layers of the interference layer system including the intermediate layer are obliquely deposited on the lens surface.

In certain embodiments, the intermediate layer is made of a material selected from $MgF_2$, $ErF_3$, $AlF_3$, chiolith ($Na_5Al_3F_{14}$), kryolith ($Na_3AlF_6$), $DyF_3$, and $SiO_2$.

In some embodiments, the interference layer system includes an alternating sequence of first layers of a first material and second layers of a second material, where the first material at the operating wavelength has a refractive index smaller than the refractive index of quartz glass ($SiO_2$) and the second material at the operating wavelength has a refractive index larger than the refractive index of quartz glass ($SiO_2$).

In certain embodiments, the interference layer system is configured in such a way that for light of a given operating wavelength which falls on the optical surface within an angular range up to a maximum angle of incidence that is predetermined by the optical system, a first distribution of retardations which is caused within the interference layer system by different border surface transmissivities for mutually orthogonal states of polarization is substantially compensated by a second distribution of retardations which is caused within the interference layer system by form birefringence.

In some embodiments, the second distribution of retardations which is caused within the interference layer system by form birefringence, is adjusted in such a way that a total effective phase split between orthogonal states of polarization which is caused by the interference layer system in light of the given operating wavelength which falls on the optical surface in an angular range up to the maximum angle of incidence which is predetermined by the optical system, does not exceed a maximum of ±5° (e.g., does not exceed a maximum of ±30, does not exceed a maximum of ±20).

In certain embodiments, at least one layer of the interference layer system has a column structure formed of a multitude of columns built up of the layer material, with each column having a column axis, and with pores lying between the columns, where a column-inclination angle as measured between each column axis and the surface-normal direction of the optical surface varies over the optical surface for the purpose of adjusting the form birefringence that causes the second distribution of retardations.

In some embodiments, at least one layer of the interference layer system has a variable thickness.

In certain embodiments, the thickness varies within a range of no more than 20% of the maximum thickness of the layer.

In some embodiments, the inference layer system is an antireflex coating.

In certain embodiments, the optical element is an optical element that is transparent for light of the operating wavelength.

In some embodiments, the operating wavelength is shorter than 250 nm (e.g., shorter than 200 nm, shorter than 160 nm).

In another aspect, the invention features an optical system, such as an illumination device or a projection objective of a microlithographic projection exposure apparatus. The optical system includes at least one optical element which carries an interference layer system on at least one optical surface. The interference layer system is configured in such a way that for light of a given operating wavelength which falls on the optical surface within an angular range up to a maximum angle of incidence that is predetermined by the optical system. A first distribution of retardations which is caused within the interference layer system by different border surface transmissivities for two mutually orthogonal states of polarization is substantially compensated by a second distribution of retardations which is caused within the interference layer system by form birefringence.

It is believed that, according to this aspect, the effect of form birefringence is used in a specifically targeted way in order to compensate partially or even completely for the retardation or phase split occurring within an interference layer system such as, for example, an anti-reflex coating as a result of different border surface transmissivities between the individual layers (e.g., due to different Fresnel coefficients of the s-component and the p-component of the electrical field vector). Thus, the interference layer system can exhibit substantially neutral behavior in regard to polarization, so that the desired effect (e.g., an antireflex effect) can be achieved without an undesirable disruption of the state of polarization of the light passing through the interference layer system.

The terminology "substantially compensated" as used herein also encompasses levels of compensation that are less than perfect. In particular, the maximum values of the first distribution of retardation can preferably be reduced by the second retardation distribution by at least 50% (e.g., at least 60%, at least 70%).

In some embodiments, the maximum angle of incidence which is predetermined by the optical system is at least 45° (e.g., at least 55°, at least 60°).

In certain embodiments, the second retardation distribution which is caused by form birefringence within the interference layer system is adjusted in such a way that a total effective phase split between orthogonal states of polarization which is caused by the interference layer system in light of the given operating wavelength which falls on the optical surface in an angular range up to the maximum angle of incidence that is predetermined by the optical system does not exceed a maximum of ±5° (e.g., does not exceed a maximum of ±30, does not exceed a maximum of ±20).

The form birefringence discussed above is distinguished from an additional retardation caused by the layer structure, which is caused within the interference layer system by different respective border transmissivities for two orthogonal states of polarization. This latter retardation is caused by different Fresnel coefficients for s- and p-polarization, respectively, as illustrated in a schematic form of representation in FIG. 2, where border surfaces between consecutive layers 0, 1, 2, . . . and an individual light ray are indicated schematically. A light beam is composed of an infinite number of such individual rays. At anti-reflex coatings the rays of both directions of polarization are transmitted almost completely. The s-polarized light which is the sum of all s-polarized partial rays that are reflected several times as they pass through the coating therefore usually has a longer optical path than the p-polarized light.

According to the above aspect of the invention, the retardation that is caused in the interference layer system by the different respective transmissivities for s- and p-polarization is compensated directly, i.e. in the layer system itself, so that the layer system overall no longer generates a resultant retardation of any practical significance.

This compensation can be performed in such a way that the phase split which is caused in the interference layer system by form birefringence is adjusted or modulated over the entire surface of the interference layer system in a suitable way, i.e. so that the phase split is just about substantially compensated.

In some embodiments, at least one layer of the interference layer system has a variable thickness serving the purpose of adjusting the form birefringence which causes the second distribution of retardations.

According to a further aspect, the invention features an optical element having at least one curved lens surface which carries an interference layer system. The interference layer system includes an alternating sequence of layers. At least one of the layers is subdivided by at least one intermediate layer which has a thickness of not more than 5 nm. A column structure which is formed in the at least one subdivided layer is interrupted by the at least one intermediate layer.

According to an additional aspect, the invention features an optical element having at least one curved lens surface which carries an interference layer system. The interference layer system includes an alternating sequence of layers. At least one of the layers is subdivided by at least one intermediate layer which has a thickness of not more than 5 nm. A column structure which is formed in the at least one subdivided layer is interrupted by the at least one intermediate layer. The intermediate layer has the effect of modifying an effective birefringence distribution of the interference layer system.

According to a further aspect, the invention features a method for the manufacture of an optical element by depositing an interference layer system on at least one optical surface of a substrate. The interference layer system is deposited in such a way that for light of a given operating wavelength which falls on the optical surface within an angular range up to a given maximum angle of incidence. A first distribution of retardations which is caused within the interference layer system by different border surface transmissivities for mutually orthogonal states of polarization is substantially compensated by a second distribution of retardations which is caused within the interference layer system by form birefringence.

In some embodiments, in at least one layer of the interference layer system, a column structure consisting of a multitude of columns that are formed of the layer material is formed, with each column having a column axis, and with pores lying between the columns, where a column-inclination angle ($\alpha$) as measured between each column axis and the surface-normal direction of the optical surface, is varied over the optical surface for the purpose of adjusting the form birefringence that causes the second distribution of retardations.

In certain embodiments, a distribution profile of the distribution of retardations that is caused in the interference layer system by form birefringence is adjusted by use of one of the following or a combination of the following:
  a) varying a vapor-deposition temperature during a vapor-deposition process for depositing the interference layer system on the substrate;
  b) varying, across the optical surface, a column inclination angle in a column structure within at least one layer of the interference layer system;
  c) varying the layer thickness of at least one layer of the interference layer system; or
  d) inserting at least one intermediate layer during the deposition of the interference layer system, whereby a column structure that is being formed during the deposition of the interference layer system is interrupted.

In some embodiments, one or more of the systems or methods can be used in a microlithographic projection exposure apparatus, a method for the manufacture of an optical element, a method for the microlithographic manufacture of microstructured components, as well as a microstructured component.

Further embodiments of the invention can be found in the description as well as in the subordinate claims.

The disclosure will hereinafter be explained in more detail with references to the examples that are illustrated in the attached drawings.

DETAILED DESCRIPTION OF PREFERRED EMBODIMENTS

In order to provide an optical element, for example a lens of an illumination device or a projection objective of a microlithographic projection exposure apparatus, with an interference layer system, for example an anti-reflex coating, the first step is to select a suitable interference layer system in accordance with the required transmission properties.

An example of an interference layer system is given in Table 1, wherein the thicknesses of the individual layers are in each case indicated in nanometers (nm) as well as in QWOT units (wherein QWOT stands for "quarter wave optical thickness").

TABLE 1

| Layer thickness [nm] | QWOT | Layer material |
|---|---|---|
| 4 | 0.20 | $LaF_3$ |
| 16 | 0.60 | $MgF_2$ |
| 6 | 0.26 | $LaF_3$ |
| 32 | 1.22 | $MgF_2$ |
| 41 | 1.91 | $LaF_3$ |
| 29 | 1.13 | $MgF_2$ |
| 21 | 0.97 | $LaF_3$ |
| 26 | 1.00 | $MgF_2$ |

Figure 1:
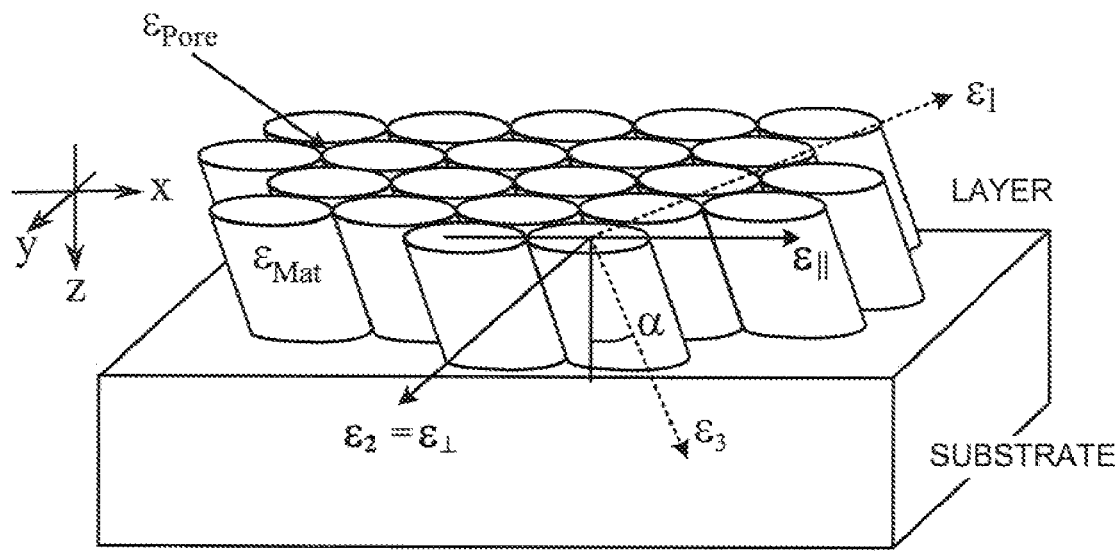
FIG. 1 schematically illustrates a coating structure for the purpose of explaining the effects of form birefringence.
Figure 2:
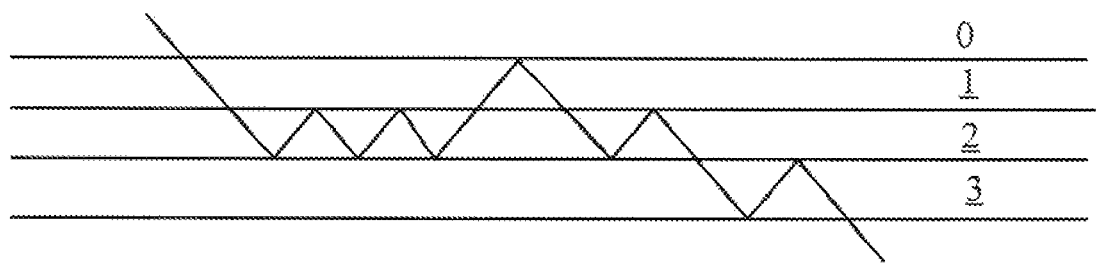
FIG. 2 represents a schematic sketch that serves to explain how a retardation is caused by different respective border surface transmissivities for s- and p-components of the electrical field vector.
Figure 3:
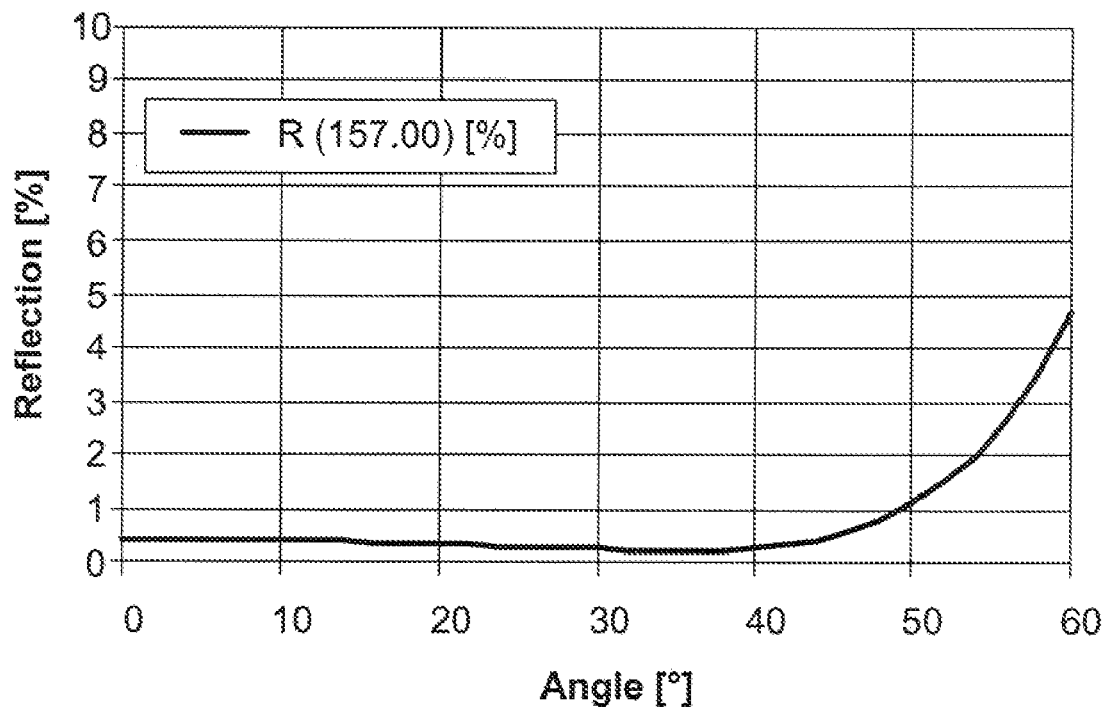
FIG. 3 illustrates in an example of an interference layer system how the degree of reflection depends on the angle of incidence at an operating wavelength of 157 nm.
Figure 4:
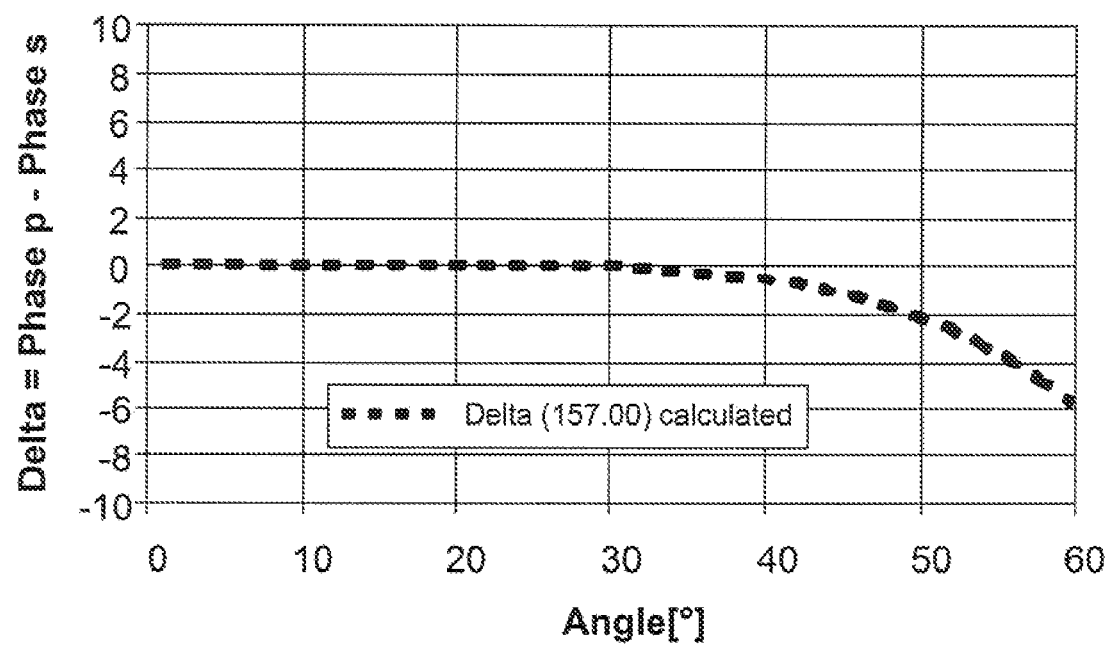
FIG. 4 illustrates the result of a calculation of the angle dependence of the phase split between the s-component and the p-component of the electrical field vector for the interference layer system of FIG. 3 in the absence of form birefringence.

FIG. 3 shows the degree of reflection for an operating wavelength of 157 nm, and FIG. 4 shows the angle-dependent phase split according to calculations, i.e., the phase difference Delta due to birefringence, where Delta stands for the phase difference, i.e. Delta=phase (p)–phase (s), between the s-component and the p-component of the electrical field vector of the light that is transmitted through the interference layer system at an operating wavelength of 157 nm as a function of the angle of incidence. As can be seen in FIG. 4, practically no phase split occurs up to about 30°. In contrast to this, a phase split of about 4 to 5° manifests itself in the area towards higher angles of incidence, for example at an angle of incidence of 55°. Often, the angle of incidence increases towards the border of the lens.

As a way to avoid this kind of a phase split and with it an undesirable change in the state of the polarization of light that is transmitted by the interference layer system, a "form-birefringent" coating is now applied to in the area towards the border of the lens, as prescribed by the disclosure, i.e., an additional retardation is introduced in that area of the lens through a specifically targeted change of the column structure that causes the form birefringence—for example through a process-controlled change of the angle of inclination of the columns in the individual layers of the interference layer system—wherein the additionally introduced retardation is just of the right magnitude to compensate for the retardation that exists without form birefringence.

Figure 5:
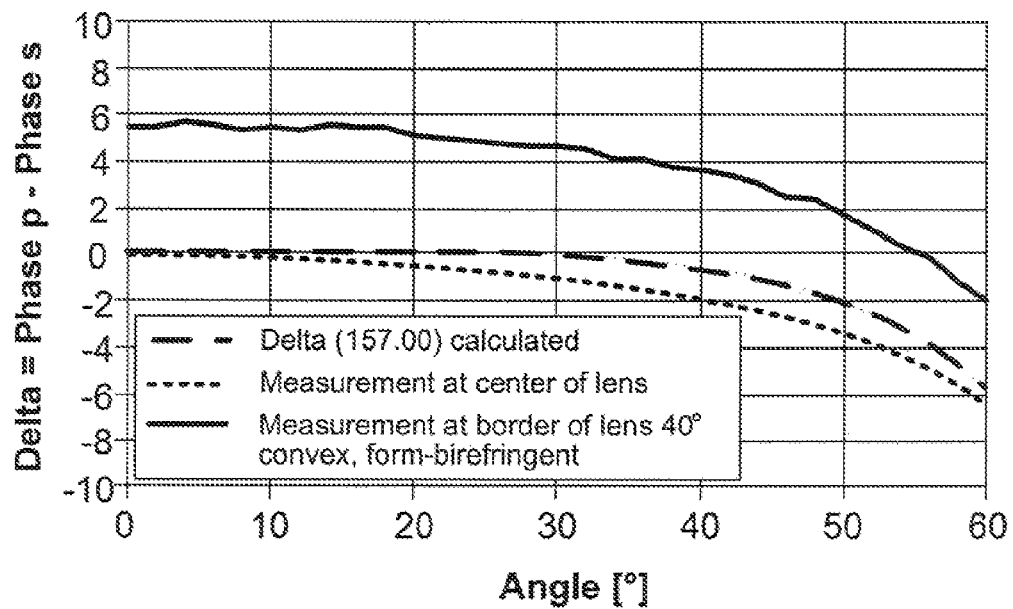
FIG. 5 represents the angle dependence of the phase split between the s-component and the p-component of the electrical field vector in the absence of form birefringence for the interference layer system of FIG. 3 as calculated in accordance with FIG. 4 and also as determined by measurements, and additionally illustrates an angle dependence of the phase split as determined by measurements in the case of an oblique vapor deposition.

The procedure for achieving the aforementioned process-controlled change will now be explained in more detail with reference to FIG. 5. The broken-line graphs in FIG. 5 represent the phase split in the case of a perpendicular vapor deposition, while the solid-line graph represents the phase split for a point on the lens with a 40°-inclinded vapor deposition. All measurements of the phase split have been done using an ellipsometer in transmission which directly gives the measurement values shown in the diagram.

The phase split distribution described by the solid-line graph contains a form birefringence component which is due to the oblique orientation of the columns. It turns out that for light with an angle of incidence of about 55°, this oblique vapor deposition leads to a resultant phase split around zero, meaning that the form birefringence contribution is just of the magnitude where it will compensate for the face split that exists due to different border surface transmissivities for the s- and p-component, respectively, without taking the form birefringence into account. As is further apparent from FIG. 5, the form birefringence that is introduced as a consequence of the oblique vapor deposition in essence leads to an offset which is additively superimposed on the profile that is obtained without form birefringence substantially over the entire range of incidence angles. The magnitude of this offset, i.e., the amount by which the solid-line graph is displaced due to the form birefringence, can now be controlled in a specifically targeted manner by varying the inclination of the columns (through the angle of vapor deposition), the thickness of the layers, the number of pores (by adjusting the temperature), as well as by inserting intermediate layers for the purpose of interrupting or stopping the growth of the columns.

Figure 6:
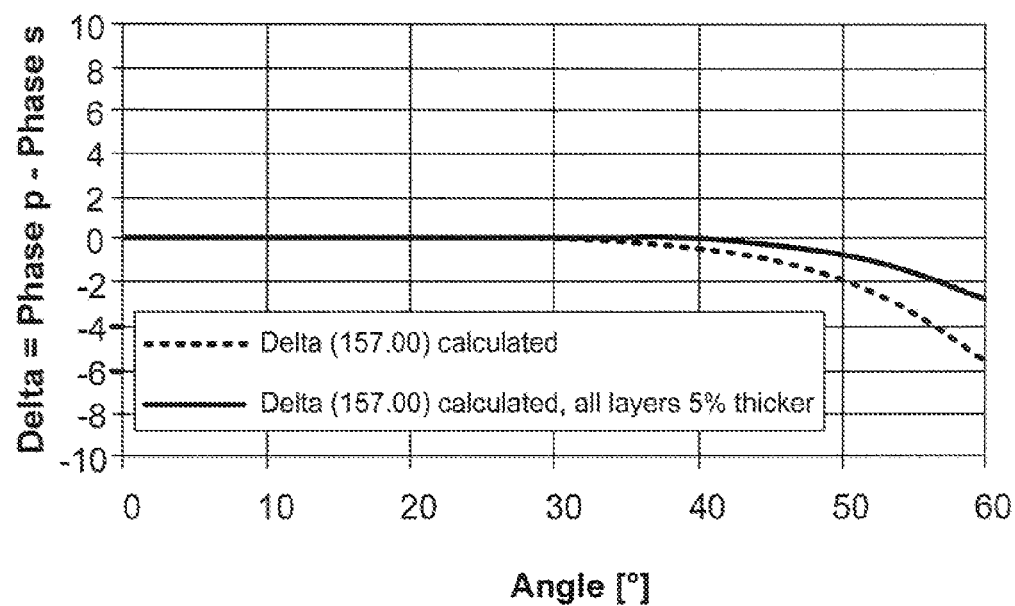
FIG. 6 represents a calculated angle dependence of the phase split between the s-component and the p-component of the electrical field vector for different layer thicknesses.

FIG. 6 demonstrates in addition how an increase of the layer thickness (e.g. by 5% for all layers of the interference layer system) leads to a change of the phase split that is obtained as a consequence of different respective border surface transmissivities for the s- and p-component. It should be noted in this case that when the layer thickness is increased, the phase split obtained from form birefringence will increase, while the phase split that is due to different respective border surface transmissivities for the s- and p-component will in most cases decrease.

In total, the portion of the phase split that is contributed by the form birefringence for the entire layer system is obtained from the sum of the respective contributions of the individual layers, wherein the contribution of an individual layers as a function of their geometry and the coating parameters can be assumed to conform in practice approximately to the following relationship:

$$\text{Delta}_{FDB}=K*\delta*B*d \quad (3)$$

wherein K represents a factor which depends on the temperature in the coating process and on the coating material, δ represents the tangent angle at the lens, B the aperture strength, and d the coating thickness. For values of B smaller than one, the vapor deposition angles are reduced, and for B larger than one, they are increased. In practice, the foregoing relationship represents quite a good approximation for a tangent angle up to at least 50°.

In this manner, one achieves through a specifically targeted setting of the form birefringence over the lens that the total of the retardation (i.e., taking into account the form birefringence and the different respective border surface transmissivities for s- and p-component within the interference layer system) remains close to zero, so that the interference layer system deposited on the lens behaves overall over the relevant range of incidence angles in a neutral manner with regard to polarization.

The following measures are used either individually or in combination in order to set the degree of modulation of the form birefringence (i.e. the shift in the solid curve of FIG. 5):

a) Setting the temperature in order to change the pore count. Generally, with a lower temperature, a higher number of pores (i.e. for example more air) is built into the layer system, where due to the oblique growth of the columns the air distributes itself anisotropically in the layer, which causes increasing differences in the indices of refraction in different directions. With the inclusion of a larger quantity of air due to a lower temperature setting, it is thus possible to achieve an increasing shift of the curve. The change in form birefringence as a function of temperature is described, e.g., in WO 03/077007.

b) Changing the column direction with a suitable aperture technique. With this measure, the vapor deposition geometry is modified by suitable obscuration aperture stops for example in order to select a range with larger vapor deposition angles from the existing bundle (to achieve a larger shift in the solid curve of FIG. 5), or to select a range with smaller vapor deposition angles (to achieve a smaller shift in the aforementioned curve). A method of controlling the vapor deposition angle is described for example in US 6,863,398 B2, whose disclosure content is hereby incorporated by reference in its entirety in the present application. For example, an obscuration stop may cut off the lower vapor deposition angles, so that only a portion of the bundle with a relatively large vapor deposition angle falls on the lens, whereby a relatively large shift of the curve is obtained. Accordingly, by arranging the obscuration aperture stop for example on the opposite side of the lens, one obtains a nearly vertical growth of the columns (and thus a small shift in the curve). For example in Dirks, Leamy; Thin Solid Films, Vol. 47, 219-221 (1977), the relationship $\tan(b)=\frac{1}{2}*\tan(a)$ is presented between the growth direction of the columns and the direction of the vapor deposition, wherein b stands for the angle of inclination of the column and a stands for the vapor deposition angle (i.e. the angle between the surface-normal direction and the vapor jet).

c) Varying the thickness of the individual layers of the layer system. The phase split due to form birefringence is represented by $\Delta n*d$ (wherein d represents the layer thickness and $\Delta n$ represents the difference of the refractive indices), so that by increasing the layer thickness a stronger shift of the curve can be achieved. It also needs to be taken into account here that by changing the layer thickness one can also influence the retardation. which is caused by different border surface transmissivities (and which decreases in most cases as the thickness increases).

d) Inserting relatively thin layers whereby the column growth can be interrupted and the alignment of the columns can be impeded. When this measure is taken, one or more intermediate layers, typically of substantially smaller thickness, are built into the alternating sequence of the layers of the layer system. For example in an $LaF_3/MgF_2$ layer system, one or more of the $LaF_3$ layers are subdivided by intermediate layers, for example by subdividing an $LaF_3$ layer of 40 nm thickness into two or three $LaF_3$ layers with a vapor-deposited intermediate layer of $MgF_2$ interposed at each division. Further suitable materials for the intermediate layer are for example $ErF_3$, $AlF_3$, chiolith ($Na_5Al_3F_{14}$), kryolith ($Na_3AlF_6$), $DyF_3$, or $SiO_2$. This has the advantage that the degree of modulation of the form birefringence can be changed without having to change the geometry of the vapor deposition apparatus, the layer thicknesses, or the temperature.

Figure 7:
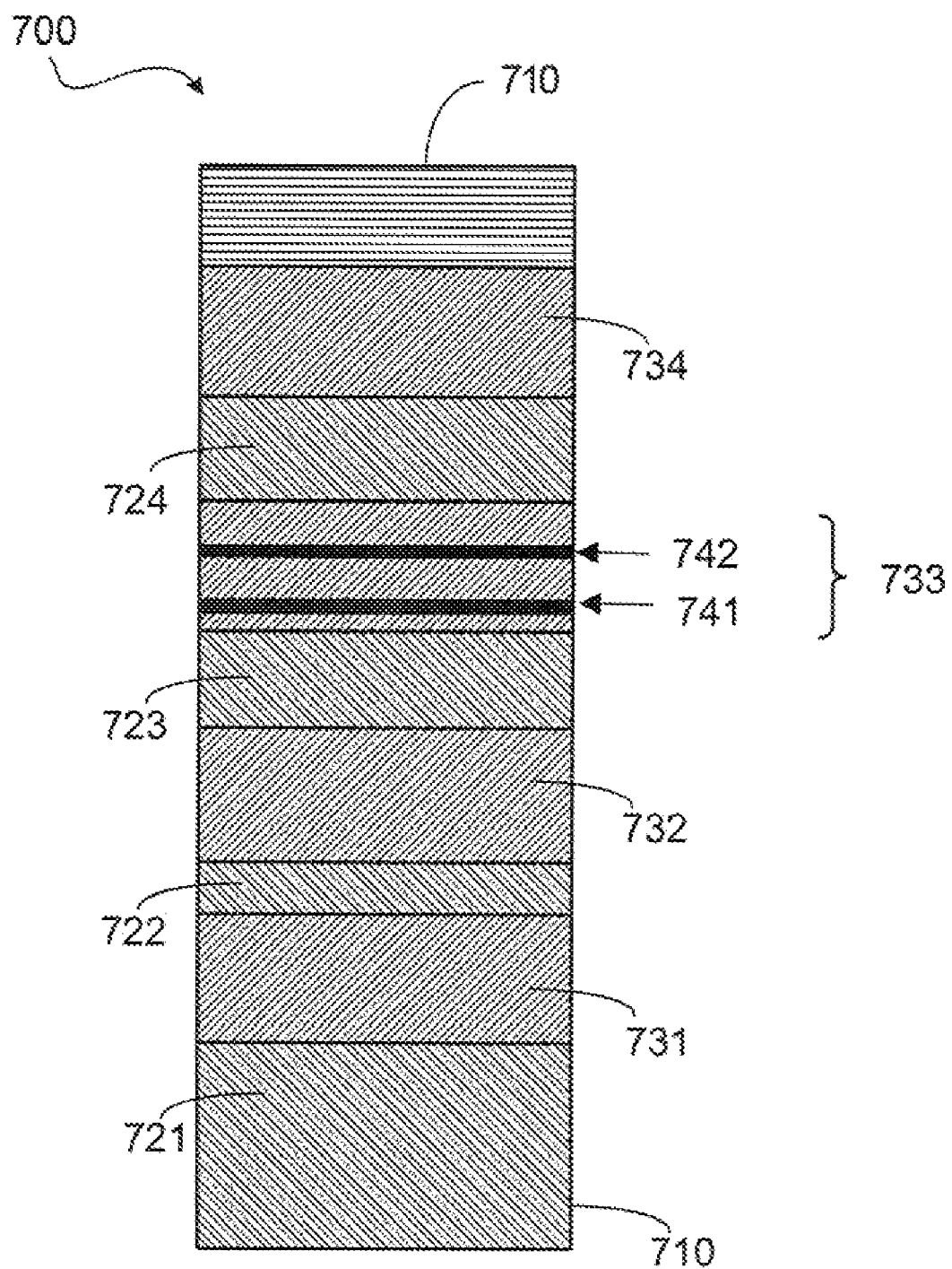
FIG. 7 schematically illustrates an interference layer system in accordance with the invention serving to explain the structure of an interference layer system according to an embodiment of the invention.

FIG. 7 schematically illustrates a section of an interference layer system according in an embodiment that is presented only for the purpose of explaining the principal structure.

The interference layer system in the section 700 that is shown in FIG. 7 has a substrate 710 (for example a lens that is transparent for light of the operating wavelength) which carries a sequence of layers that alternate between first layers 721-724 of a first coating material (for example $MgF_2$) and second layers 731-734 of a second coating material (for example $LaF_3$), wherein the layer 733 in the illustrated example is interrupted or further subdivided by two intermediate layers 741 and 742 of a third layer material. The material of the intermediate layer which in this example interrupts the layer 733 of the second material can, in turn, be made up again of the first material (i.e., $MgF_2$ in this example) or also of any other suitable material which interrupts the growth of the columns in layer 733. Particularly well suited for the intermediate layer are coating materials which by themselves introduce no birefringence or only a small amount of birefringence, such as for example $ErF_3$, $AlF_3$, chiolith ($Na_5Al_3F_{14}$), kryolith ($Na_3AlF_6$), $DyF_3$, and $SiO_2$.

Figure 8A:
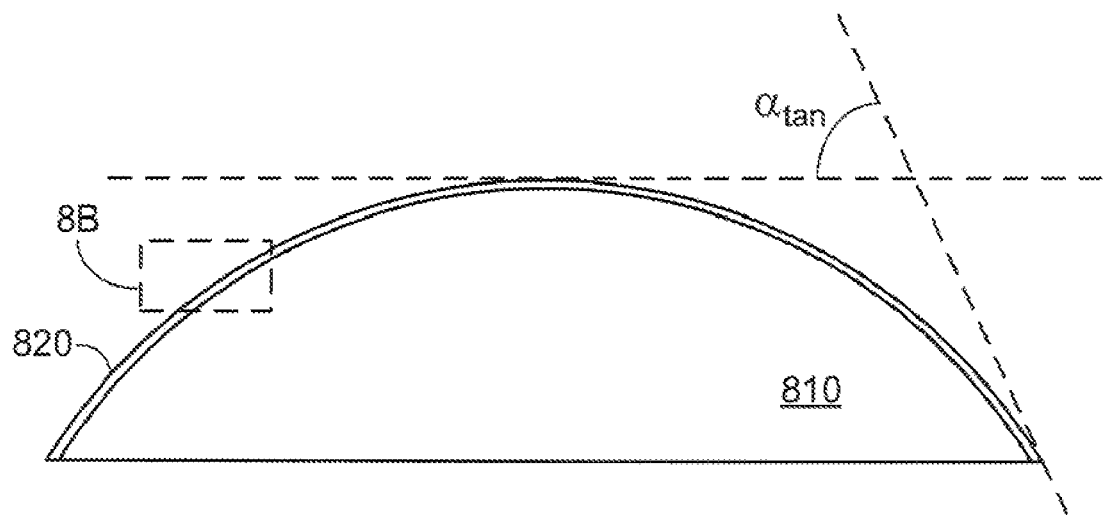
FIG. 8a-b schematically illustrate an interference layer system in accordance with the invention serving to explain the structure of an interference layer system according to a further embodiment of the invention.
Figure 8B:
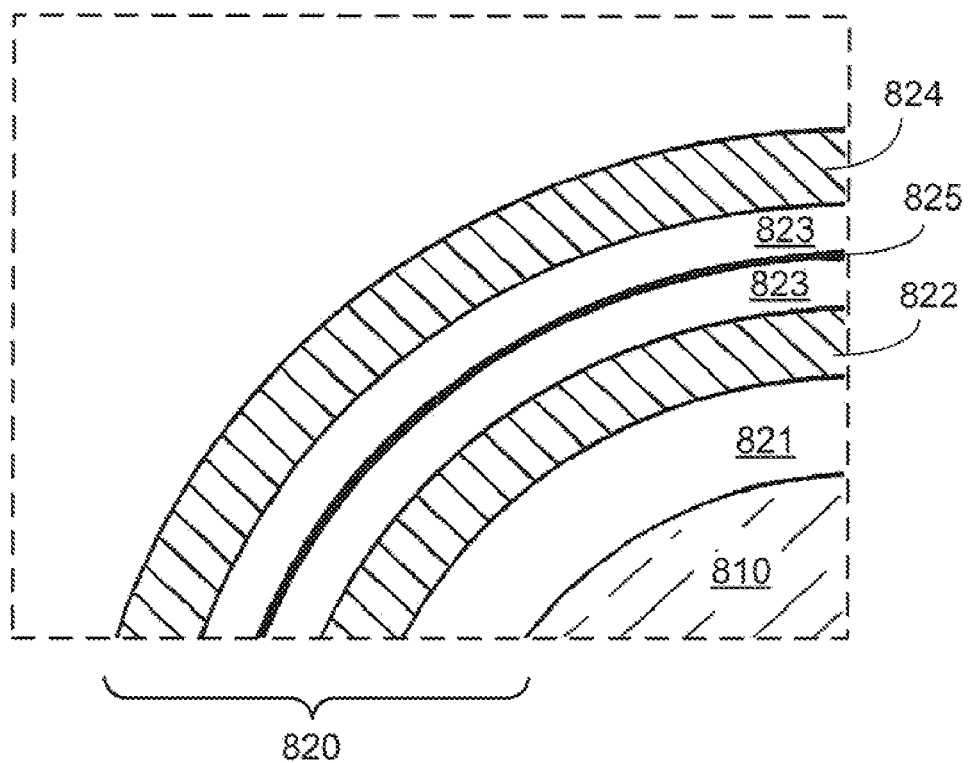

FIG. 8 a-b schematically show an embodiment in which an interference layer system 820 is provided on a curved lens surface of plano-convex lens 810. The interference layer system 820 includes, as can be seen in the enlarged view of FIG. 8b, an alternating sequence of first layers 821, 823 of a first material (for example $LaF_3$) and second layers 822, 824 of a second material (for example $MgF_2$), wherein one layer 823 of the first material is interrupted or further subdivided by an intermediate layer 825 (which may in the example e.g. be vapor-deposited intermediate layer of $MgF_2$) of substantially smaller thickness. The thickness of the intermediate layer 825 amounts to not more than 5 nanometers and is preferably in the range from 0.5 to 2 nanometers. Furthermore, the intermediate layer 825 preferably has a thickness substantially smaller than the thickness of the subdivided layer 823, which may be typically in the range of 20 to 50 nanometers. Preferably, the thickness of the intermediate layer is at least ten times smaller, more preferably at least fifteen times smaller, still more preferably at least twenty times smaller than the thickness of the subdivided layer. Of course, the embodiment of FIG. 8 is not limited to the presence of only one intermediate layer, so that also two or more intermediate layers subdividing the same or different layers of the interference layer system are also possible.

Figure 9:
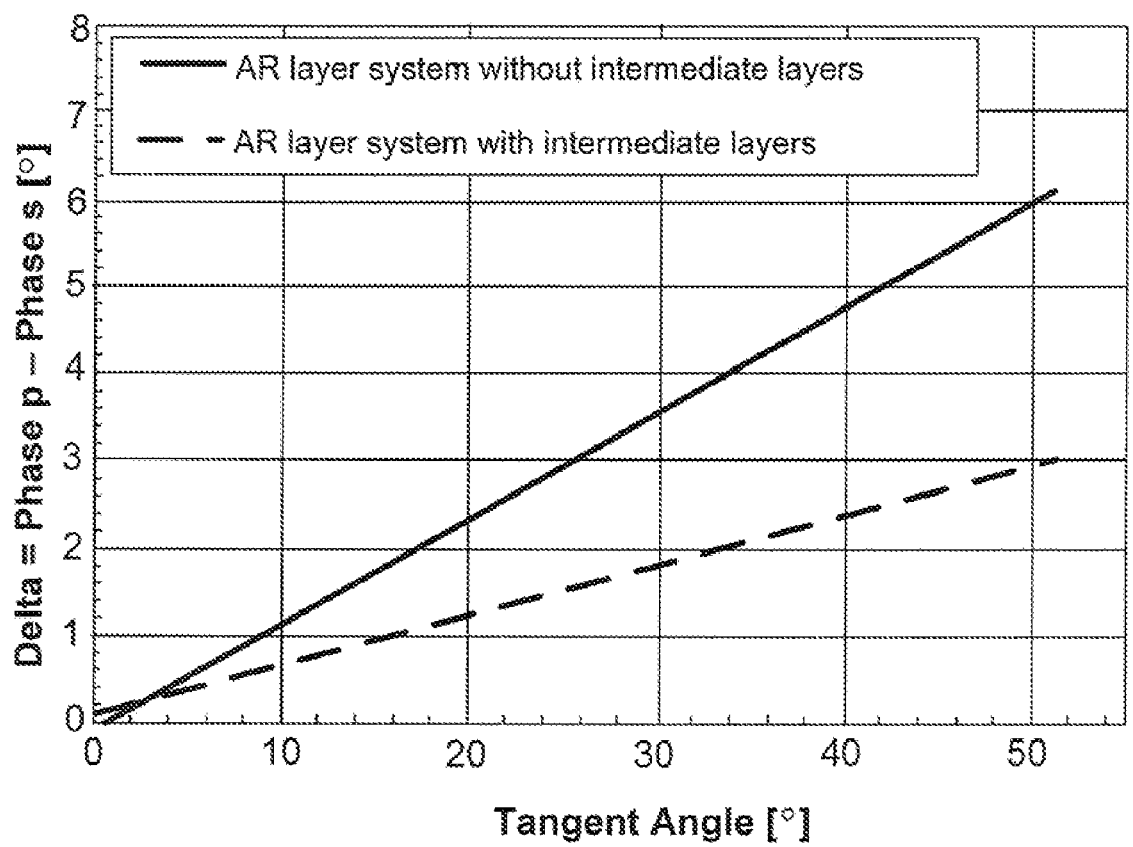
FIG. 9 represents an angle dependence of the phase split between the s-component and the p-component of the electrical field vector for different maximum tangent angles and for a typical anti-reflex coating system with and without intermediate layers.

According to FIG. 9, an angle dependence of the phase split between the s-component and the p-component of the electrical field vector has been determined for a six-layer-antireflex coating system without (solid line) and with (broken line) intermediate layers and for different values of the maximum tangent angle $\alpha_{tan}$. In Table 2, the thickness (given in nm), the optical thickness (given in full wave optical thickness=FWOT) and the material of the individual layers are indicated for the interference layer system without intermediate layers. In Table 3, the thickness and material of the individual layers are indicated for this interference layer system with intermediate layers. Accordingly, the interference layer system of Table 2 is the analogous system, compared to the interference layer system of table 3, without intermediate layers, since the order, materials and thicknesses of the interference layer system of table 3 and table 2 are identical if the intermediate layers are not taken into consideration.

TABLE 2

| Layer Thickness [nm] | Optical Thickness FWOT | Material |
|---|---|---|
| 32 | 0.25-0.3 | $LaF_3$ |
| 8 | 0.05-0.1 | $MgF_2$ |
| 12 | 0.05-0.15 | $LaF_3$ |
| 35 | 0.25-0.35 | $MgF_2$ |
| 32 | 0.2-0.3 | $LaF_3$ |
| 33 | 0.2-0.3 | $MgF_2$ |

TABLE 3

| Layer Thickness [nm] | Material |
|---|---|
| 8 | $LaF_3$ |
| 0.7 | $MgF_2$ |
| 8 | $LaF_3$ |
| 0.7 | $MgF_2$ |
| 8 | $LaF_3$ |
| 0.7 | $MgF_2$ |
| 8 | $LaF_3$ |
| 8 | $MgF_2$ |
| 6 | $LaF_3$ |
| 0.5 | $MgF_2$ |
| 6 | $LaF_3$ |
| 35 | $MgF_2$ |
| 8 | $LaF_3$ |
| 0.7 | $MgF_2$ |
| 8 | $LaF_3$ |
| 0.7 | $MgF_2$ |
| 8 | $LaF_3$ |
| 0.7 | $MgF_2$ |
| 8 | $LaF_3$ |
| 33 | $MgF_2$ |

The tangent angle $\alpha_{tan}$ as shown in FIG. 8a is defined for each position on the optically active lens surface as the angle between the tangent to the lens surface at this position and the tangent to the tangent to the lens surface at the vertex of the curved lens surface. It can be gathered from FIG. 9 that, while for both graphs the phase split linearly increases with increasing maximum tangent angle, the slope of the graph as well as the absolute values of the phase split are, for values of the tangent angle significantly larger than zero, substantially smaller for the anti-reflex coating system of table 3 (i.e. including intermediate layers) than for the analogous anti-reflex coating system of table 2 (i.e. without intermediate layers).

Figure 10:
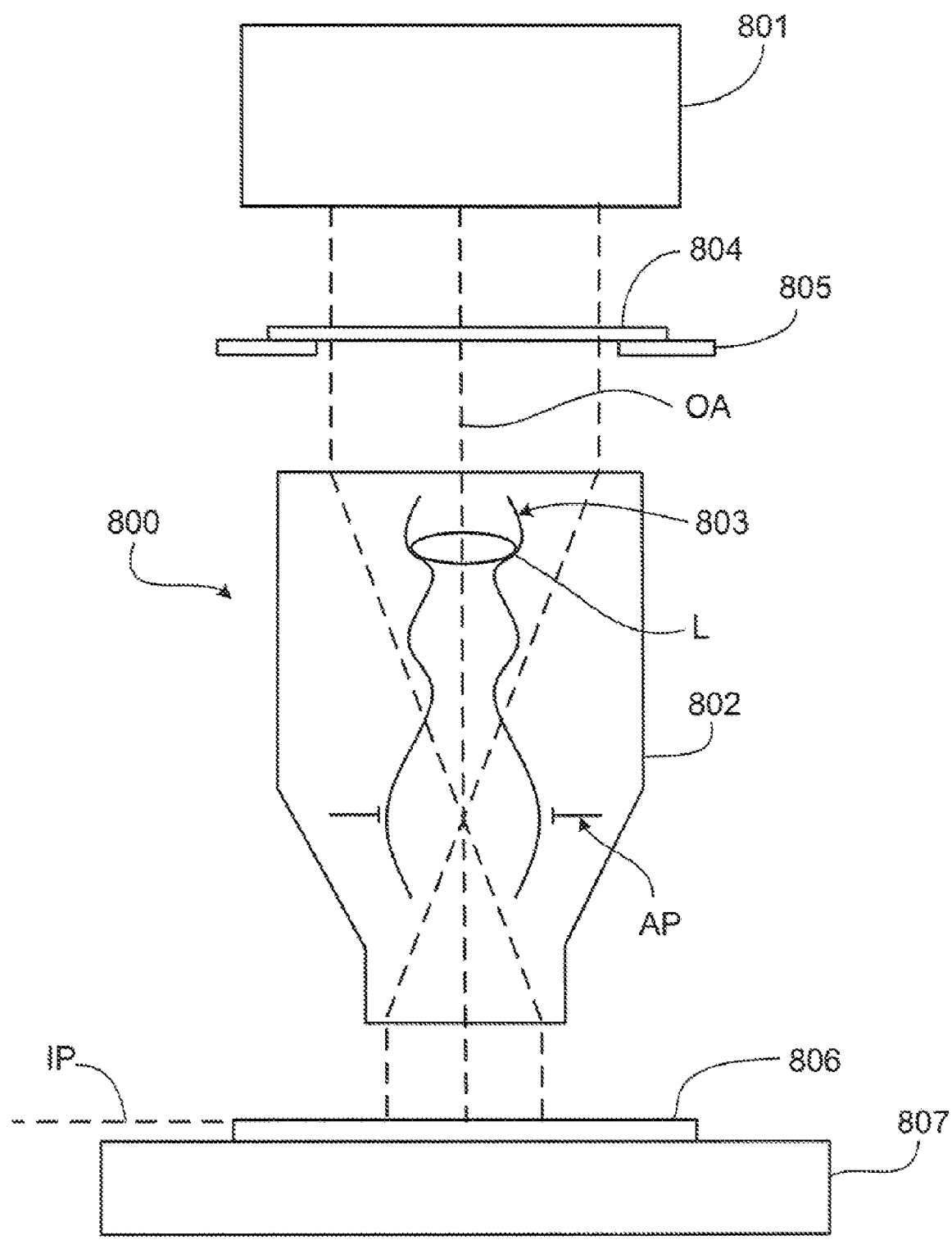
FIG. 10 represents a schematic illustration serving to explain the principal design structure of a microlithographic projection exposure apparatus.

FIG. 10 schematically illustrates the overall layout of a microlithographic projection exposure apparatus with an illumination system.

As shown in FIG. 10, a projection exposure apparatus 800 includes an illumination device 801 and a projection objective 802. The projection objective 802 includes a lens arrangement 803 with an aperture stop AP, wherein an optical axis OA is defined by the lens arrangement 803 which is only schematically indicated. Also shown only in a schematic manner is a lens L which can carry for example an antireflex coating in the form of an interference layer system.

Arranged between the illumination device 801 and the projection objective 802 is a mask 804 which is held in the light path by use of a mask holder 805. The mask 804 carries a structure in the micron-to-nanometer order of magnitude, which is projected by use of the projection objective 802 onto an image plane IP, for example with an image-reduction factor of 4 or 5. In the image plane IP, a light-sensitive substrate 806 or a wafer is held in place which is set into position by a substrate holder 807. The smallest structures that can be resolved by the apparatus depend on the wavelength $\lambda$ of the light that is used for the illumination and also on the numerical aperture on the image side of the projection objective 802, where the maximum resolution that can be achieved with the projection exposure apparatus 800 increases as the wavelength $\lambda$ of the illumination device 801 is made shorter and as the image-side numerical aperture of the projection objective 802 is made larger.

Even though numerous embodiments are disclosed, those skilled in the pertinent art will recognize numerous possibilities for variations and alternative embodiments, for example by combining and/or exchanging features of individual embodiments. Accordingly, it will be understood that such variations and alternative embodiments are considered as being included within the scope of the invention, which is limited only by the attached patent claims and their equivalents.

The invention claimed is:

1. An optical system, comprising:
    at least one optical element having at least one curved lens surface which carries an interference layer system, the interference layer system comprising an alternating sequence of layers,
    wherein at least one of the layers is subdivided by at least one intermediate layer having a thickness of not more than 5 nanometers, and a column structure which is formed in the at least one subdivided layer is interrupted by the at least one intermediate layer.

2. The optical system according to claim 1, wherein a retardation in the interference layer system caused by form birefringence is reduced due to the intermediate layer in comparison to an analogous interference layer system that does not comprise the intermediate layer.

3. The optical system according to claim 1, wherein the at least one intermediate layer has a thickness at least ten times smaller than the thickness of the subdivided layer.

4. The optical system according to claim 1, wherein the at least one intermediate layer has an optical thickness of not more than 2 nm.

5. The optical system according to claim 1, wherein the at least one intermediate layer has an optical thickness that is less than 0.05 times the thickness of the operating wavelength.

6. The optical system according to claim 1, wherein the curved lens surface has a maximum tangent angle of its optically active surface of at least 20°, the tangent angle being defined for each position on the optically active lens surface as the angle between the tangent to the lens surface at this position and the tangent to the lens surface at the vertex of the curved lens surface.

7. The optical system according to claim 1, wherein all layers of the interference layer system including the intermediate layer are obliquely deposited on the lens surface.

8. The optical system according to claim 1, wherein the intermediate layer is made of a material selected from the group consisting of $MgF_2$, $ErF_3$, $AlF_3$, chiolith ($Na_5Al_3F_{14}$), kryolith ($Na_3AlF_6$), $DyF_3$, and $SiO_2$.

9. The optical system according to claim 1, wherein the interference layer system comprises an alternating sequence of first layers of a first material and second layers of a second material, the first material at the operating wavelength has a refractive index smaller than the refractive index of quartz glass ($SiO_2$), and the second material at the operating wavelength has a refractive index larger than the refractive index of quartz glass ($SiO_2$).

10. The optical system according to claim 1, wherein the interference layer system is configured in such a way that for light of a given operating wavelength which falls on the optical surface within an angular range up to a maximum angle of incidence that is predetermined by the optical system, a first distribution of retardations which is caused within the interference layer system by different border surface transmissivities for mutually orthogonal states of polarization is substantially compensated by a second distribution of retardations which is caused within the interference layer system by form birefringence.

11. The optical system according to claim 10, wherein the second distribution of retardations which is caused within the interference layer system by form birefringence, is adjusted in such a way that a total effective phase split between orthogonal states of polarization which is caused by the interference layer system in light of the given operating wavelength which falls on the optical surface in an angular range up to the maximum angle of incidence which is predetermined by the optical system, does not exceed a maximum of ±5°.

12. The optical system according to claim 1, wherein the maximum angle of incidence which is predetermined by the optical system is at least 45°.

13. The optical system according to claim 1, wherein at least one layer of the interference layer system has a column structure formed of a multitude of columns built up of the layer material, with each column having a column axis, and with pores lying between the columns, wherein a column-inclination angle as measured between each column axis and the surface-normal direction of the optical surface varies over the optical surface for the purpose of adjusting the form birefringence that causes the second distribution of retardations.

14. The optical system according to claim 1, wherein at least one layer of the interference layer system has a variable thickness.

15. The optical system according to claim 14, wherein the thickness varies within a range of no more than 20% of the maximum thickness of the layer.

16. The optical system according to claim 1, wherein the inference layer system is an anti-reflex coating.

17. The optical system according to claim 1, wherein the optical element is an optical element that is transparent for light of the operating wavelength.

18. The optical system according to claim 1, wherein the operating wavelength is shorter than 250 nm.

19. A microlithographic projection exposure apparatus with an optical system according to claim 1.

20. A method for the microlithographic manufacture of microstructured components, comprising:
    providing a substrate to which at least one layer of a light-sensitive material is applied;
    providing a mask which comprises structures of which an image is to be projected;
    providing a projection exposure apparatus according to claim 19; and
    projecting at least a part of the mask onto an area of the light-sensitive layer by use of the projection exposure apparatus.

21. The optical system of claim 1, wherein the optical system is an illumination device or a projection objective of microlithographic projection exposure apparatuses.

22. An optical element, comprising:
    at least one curved lens surface which carries an interference layer system, the interference layer system comprising an alternating sequence of layers,
    wherein at least one of the layers is subdivided by at least one intermediate layer which has a thickness of not more than 5 nm, wherein a column structure which is formed in the at least one subdivided layer is interrupted by the at least one intermediate layer.

23. The optical element according to claim 22, wherein a retardation in the interference layer system caused by form birefringence is reduced due to the intermediate layer in comparison to an analogous interference layer system that does not comprise the intermediate layer.

24. A microlithographic projection exposure apparatus with an optical element according to claim 22.

* * * * *

UNITED STATES PATENT AND TRADEMARK OFFICE
CERTIFICATE OF CORRECTION

PATENT NO. : 7,518,797 B2
APPLICATION NO. : 11/607024
DATED : April 14, 2009
INVENTOR(S) : Alexandra Pazidis and Christoph Zaczek It is certified that error appears in the above-identified patent and that said Letters Patent is hereby corrected as shown below:

Column 3, line 42, delete "200" insert --20°--.

Column 4, line 12, delete "±30" insert --±3°--.

Column 4, line 12, delete "±20" insert --±2°--.

Column 4, line 26, delete "inference" insert --interference--.

Column 4, line 27, delete "antireflex" insert --anti-reflex--.

Column 4, line 59, delete "antireflex" insert --anti-reflex--.

Column 5, line 12, delete "±30" insert --±3°--.

Column 5, line 13, delete "±20" insert --±2°--.

Column 9, line 61, delete "retardation." insert --retardation--.

Column 11, line 50, delete "tangent to the tangent to" insert --tangent to--.

Column 12, line 2, delete "antireflex" insert --anti-reflex--.

Column 14, line 8, Claim 16, delete "inference" insert --interference--.

Signed and Sealed this

First Day of September, 2009

David J. Kappos
*Director of the United States Patent and Trademark Office*